United States Patent [19]

Saito et al.

[11] 4,254,390
[45] Mar. 3, 1981

[54] COMPACT ELECTRONIC TUNING DEVICE

[75] Inventors: Mitsuo Saito; Mitsuo Makimoto; Sadahiko Yamashita, all of Kawasaki, Japan

[73] Assignee: Matsushita Electric Industrial Co., Ltd., Osaka, Japan

[21] Appl. No.: 15,602

[22] Filed: Feb. 27, 1979

[30] Foreign Application Priority Data

Feb. 28, 1978 [JP] Japan .................. 53-22972

[51] Int. Cl.$^3$ .......................... H03T 3/00; H03T 1/00; H03T 5/00
[52] U.S. Cl. ..................................... 334/85; 334/45; 333/12; 333/222
[58] Field of Search ................... 334/41, 42, 45, 85; 333/230, 235, 203, 207, 222, 223, 204, 238, 246, 12

[56] References Cited

U.S. PATENT DOCUMENTS

| 2,754,484 | 7/1956 | Adams | 333/246 |
| 3,569,850 | 3/1971 | Wegener et al. | 334/45 |

Primary Examiner—Alfred E. Smith
Assistant Examiner—Thomas P. O'Hare
Attorney, Agent, or Firm—Lowe, King, Price & Becker

[57] ABSTRACT

A tuning device including a conductive housing in which are suspended a dielectric substrate. A pair of first and second resonant circuits is disposed on the substrate in parallel with each other. Each resonant circuit is formed by an elongated conductive film and a capacitive element. A grounded conductive strip film is provided between the transmission lines of the first and second resonant circuits to reduce the interstage coupling between the two transmission lines with a resultant decrease in spacing between them.

4 Claims, 5 Drawing Figures

COMPACT ELECTRONIC TUNING DEVICE

FIELD OF THE INVENTION

The present invention relates to tuning devices for microwave frequencies, and in particular to such a tuning device whose structural dimensions are kept to a minimum by the provision of a grounded elongated conductive film disposed between identical resonant circuits.

BACKGROUND OF THE INVENTION

Conventional electronic tuning devices comprise a pair of identical resonant circuits disposed on a dielectric substrate, each resonant circuit including a conductive elongated film serving as a transmission line and a voltage-controlled capacitive element. The transmission lines of the resonant circuits are arranged in parallel to each other. Microwave energy is coupled with one of the resonant circuits and the tuned signal is then coupled with the other resonant circuit. With this interstage coupling the passband characteristic of the tuning device has a strong peak at the center frequency of the passband with a bandwidth of 20 MHz or less at the −3 dB point from the peak value. Since the bandwidth is inversely proportional to the distance between the two transmission lines, a narrow bandwidth requirement would result in a tuning device having considerable dimensions. For example, the bandwidth requirement of 20 MHz or less is only obtained with a spacing of more than 22 mm or 27 mm at 470 MHz or 770 MHz, respectively.

SUMMARY OF THE INVENTION

The primary object of the invention is therefore to provide a compact tuning device.

This object is achieved by the provision of a grounded conductive film extending parallel between the two transmission lines of the resonant circuits and spaced therefrom. This reduces the effective interstage coupling with a resultant reduction in distance between the transmission lines. The width of the grounded conductor is determined in relation to the interstage coupling distance and to the −3 dB point bandwidth of 20 MHz.

The provision of the grounded elongated conductor permits the use of printed circuit technology for fabrication of the elements disposed on the dielectric substate. As a result, the size of the tuning device of the invention can be kept to a minimum at a low cost, while assuring the bandwidth requirement.

BRIEF DESCRIPTION OF THE DRAWINGS

The invention will be further described with reference to the accompanying drawings, in which.

DETAILED DESCRIPTION

Figure 1:
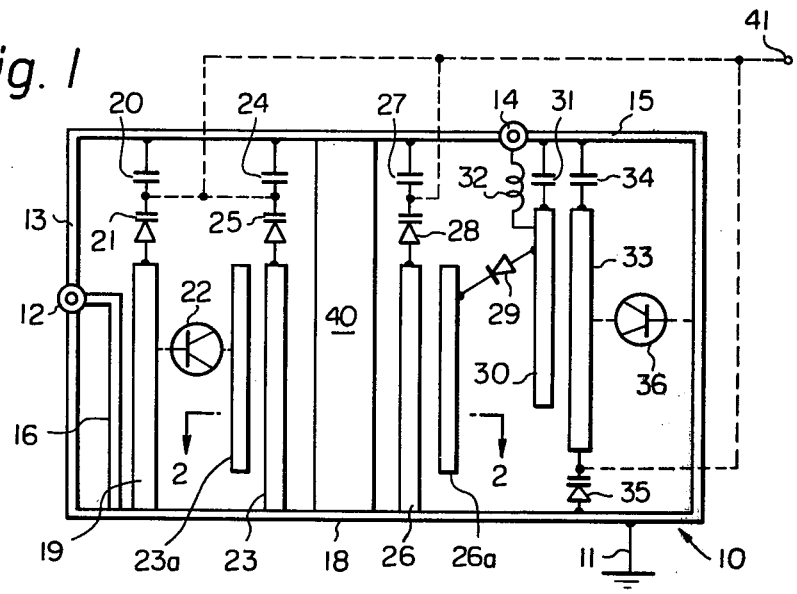
FIG. 1 is a plan view of the electronic tuning device of the invention.
Figure 2:
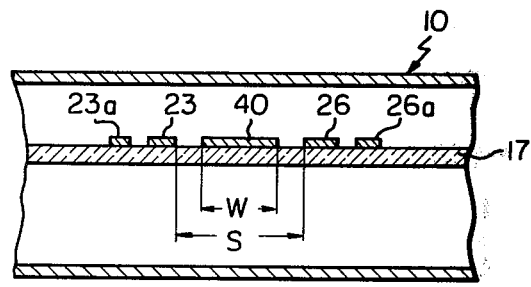
FIG. 2 is a cross-sectional view taken along the lines 2—2 of FIG. 1.

In FIG. 1, an electronic tuning device for ultrahigh frequencies is shown as comprising a conductive housing 10 which is connected to a ground potential as at 11 and provided with an input terminal 12 on an end wall 13 and an output terminal 14 on a side wall 15 of the housing. A coupling circuit formed by a conductive film strip 16 is provided on a dielectric substrate 17 formed of glass epoxy, for example, which is suspended in the housing 10 as illustrated in FIG. 2, the film strip 16 being electrically connected at one end to the input terminal and at the other end to a side wall 18 which is at the ground potential and extending parallel to the end wall 13. In parallel with the conductive strip film 16 is disposed on the substrate 17 an input quarter-wave resonant circuit formed by a conductive film strip 19 which is connected at one end to the side wall 18 to serve as an inductive element and connected at the other end to the side wall 15 and a capacitive element formed by a capacitor 20 and a voltage-controlled capacitor or varactor 21. This allows injection of microwave energy from the input terminal 12 through the coupling element 16 and through the inductive element 19 into the housing 10. The transmission line 19 is connected to the control electrode of a transistor 22 for amplification of the injected microwave energy and application of the amplified energy to a coupling element 23a and thence to a first quarter-wave resonant circuit formed by a conductive film 23 serving as a transmission line, capacitor 24 and varactor 25 connected in the same manner as the input resonant circuit as described above.

In parallel with the transmission line 23 is disposed a second quarter-wave resonant circuit formed by transmission line 26, capacitor 27 and varactor 28 in a series connection between the side walls 18 and 15. Adjacent to the transmission line 26 is provided a coupling element 26a which is connected by a mixer diode 29 to a coupling element 30 of a local oscillator formed by a half-wave resonant circuit including elements 33, 34, 35, transistor 36, coil 32 and capacitor 31. The mixer output is coupled to the output terminal 14 through coil 32. The DC control terminals of the varactors 21, 25, 28 and 35 are all connected in common to a control terminal 41.

Figure 3:
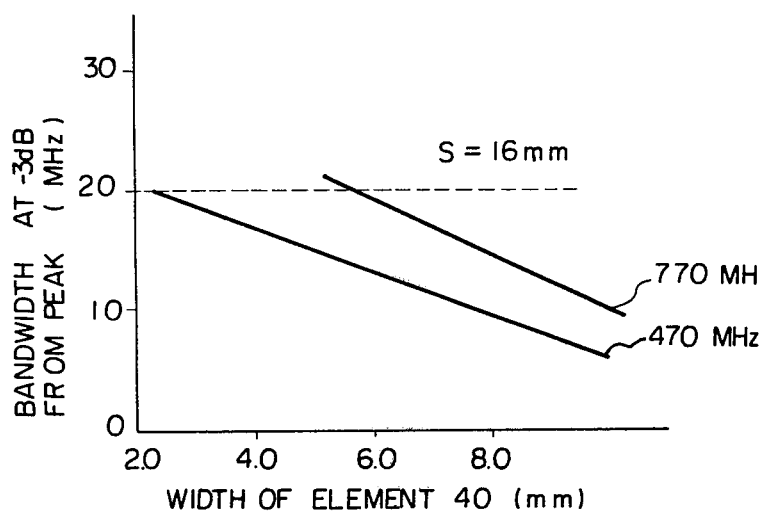
FIG. 3 is a graphic illustration of the bandwidth of the tuning device as a function of the width of the grounded conductor of FIG. 1.
Figure 4:
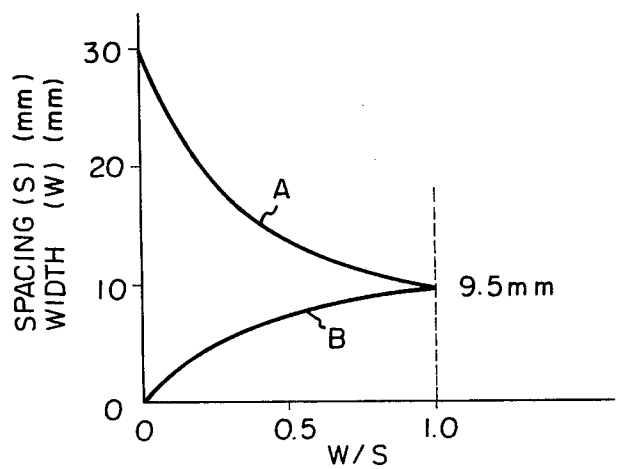
FIG. 4 is a graphic illustration of the relation between the width of the ground conductor and the distance between the two transmission lines of FIG. 1.

Between the transmission lines 23 and 26 is provided a conductive elongated film 40 connected at opposite ends to the side walls 15 and 18. The transmission lines 23, 26 and the conductive film 40 are all disposed on the substrate 17 in parallel to, and spaced from, each other as illustrated in FIG. 2. The effect of the intermediate conductive film 40 is to reduce the interstage coupling between the transmission lines 23 and 26 while assuring the required bandwidth of less than 20 MHz at the −3 dB point of the passband characteristic. As illustrated in FIG. 3, the spacing S between the elements 23 and 26 can be reduced to as low as 16 millimeters with the conductive element 40 having a width of 2.0 to 8.0 millimeters or more for the tuned frequency of 470 MHz. At a resonant frequency of 770 MHz, the width of the conductive element ranges from about 6.0 to 8.0 millimeters or more. The ratio of the width W of the conductive element 40 to the spacing S between transmission lines 23 and 26 that satisfies the 20 MHz bandwidth requirement ranges from zero to unity as shown in FIG. 4. With a 9.5 mm width of the conductive element 40, the spacing S follows a curve A as a function of ratio W/S, and with a value of 9.5 mm spacing the width W follows a curve B as a function of ratio W/S. It will be seen that the ratio W/S should be in a range from 0.2 to 0.8 and preferably at a point near 0.8.

The concept of the invention can also be used to construct a small size bandpass filter for microwave frequencies. In this case, the first and second quarter-wave resonant circuits constitute the bandpass filter.

Figure 5:
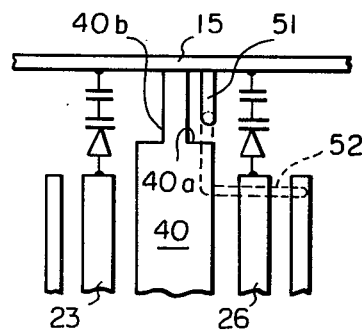
FIG. 5 is a plan view, in part, of the tuning device with an image trapping circuit.

FIG. 5 is an illustration of a modification of the invention in which an image frequency trapping circuit is provided. The image trap circuit comprises first and second elongated sections 51 and 52. A part of the first section is disposed on the upper side of the substrate 17 while the remainder section is disposed on the lower side thereof. The first section 51 is connected at one end to the side wall 15 and extends parallel with the transmission lines 23 and 26. The second section 52 of the image trap is disposed underside of the substrate and extends at right angles to the transmission line 26 and is electrically coupled with the coupling element 26a, intersecting the transmission line 26. The intermediate conductive film 40 is formed with a cutout 40a to accommodate the first section of the image trap and a second cutout 40b which is symmetrically provided on the opposite side.

What is claimed is:

1. A bandpass filter comprising:
   a conductive housing;
   a dielectric substrate supported in said housing;
   a pair of first and second resonant circuits each including an elongated conductor to serve as an inductive transmission line and a capacitive element connected to the transmission line in series between a pair of oppositely facing walls of said housing, the transmission lines of said resonant circuits being disposed on one side of said substrate and arranged parallel to each other; and
   an elongated conductor disposed on said one side of said substrate between said transmission lines and spaced therefrom and electrically connected at each end thereof with the wall of said housing.

2. A microwave tuning device as claimed in claim 1, further comprising a local oscillator, means coupled between said second resonant circuit and said local oscillator for mixing the signals therefrom, and an image frequency trapping circuit having a first section connected to said housing wall extending parallel to said transmission lines and a second section extending at right angles to said transmission lines and disposed on the opposite side of said substrate to said transmission lines, said second section intersecting one of said transmission lines.

3. A bandpass filter comprising:
   a conductive housing;
   a dielectric substrate supported in said housing;
   a pair of first and second resonant circuits each including an elongated conductor to serve as an inductive transmission line and a capacitive element connected to the transmission line in series between a pair of oppositely facing walls of said housing, the transmission lines of said resonant circuits being disposed on one side of said substrate and arranged parallel to each other;
   an elongated conductor disposed on said one side of said substrate between said transmission lines and spaced therefrom and electrically connected at each end thereof with the wall of said housing;
   a local oscillator;
   means coupled between said second resonant circuit and said local oscillator for mixing signals therefrom; and
   an image frequency trapping circuit having a first section connected to said housing wall extending parallel to said transmission lines and a second section extending at right angles to said transmission lines and disposed on the opposite side of said substrate to said transmission lines, said second station intersecting one of said transmission lines.

4. A microwave tuning device as claimed in claim 1 or claim 3, wherein said capacitive element comprises a voltage controlled capacitive element.

* * * * *